United States Patent
Ose et al.

(10) Patent No.: US 10,792,900 B2
(45) Date of Patent: Oct. 6, 2020

(54) SHEET FOR ABSORBING MOISTURE

(71) Applicant: DYNIC CORPORATION, Kyoto-shi (JP)

(72) Inventors: Nobuo Ose, Inugami-gun (JP); Kaneto Ohyama, Inugami-gun (JP)

(73) Assignee: DYNIC CORPORATION, Kyoto-shi (JP)

( * ) Notice: Subject to any disclaimer, the term of this patent is extended or adjusted under 35 U.S.C. 154(b) by 0 days.

(21) Appl. No.: 16/065,484

(22) PCT Filed: Apr. 28, 2017

(86) PCT No.: PCT/JP2017/016913
§ 371 (c)(1),
(2) Date: Jun. 22, 2018

(87) PCT Pub. No.: WO2017/188429
PCT Pub. Date: Nov. 2, 2017

(65) Prior Publication Data
US 2018/0370204 A1  Dec. 27, 2018

(30) Foreign Application Priority Data
Apr. 28, 2016  (JP) .................. 2016-091885

(51) Int. Cl.
B32B 27/30 (2006.01)
B32B 27/18 (2006.01)
B32B 7/12 (2006.01)
B32B 5/02 (2006.01)
B01D 53/28 (2006.01)
C08K 9/04 (2006.01)
C08L 27/12 (2006.01)
C08K 3/00 (2018.01)
B01J 20/04 (2006.01)
C08K 3/22 (2006.01)
H01L 23/02 (2006.01)
H01L 23/26 (2006.01)
B01D 53/26 (2006.01)
B01J 20/28 (2006.01)
B01J 20/02 (2006.01)
B01J 20/30 (2006.01)
B32B 27/32 (2006.01)
H01L 51/52 (2006.01)

(52) U.S. Cl.
CPC ............ *B32B 27/18* (2013.01); *B01D 53/261* (2013.01); *B01D 53/28* (2013.01); *B01J 20/0281* (2013.01); *B01J 20/041* (2013.01); *B01J 20/045* (2013.01); *B01J 20/28004* (2013.01); *B01J 20/28033* (2013.01); *B01J 20/28059* (2013.01); *B01J 20/3007* (2013.01); *B32B 5/02* (2013.01); *B32B 7/12* (2013.01); *B32B 27/30* (2013.01); *B32B 27/304* (2013.01); *B32B 27/322* (2013.01); *C08K 3/22* (2013.01); *C08L 27/12* (2013.01); *H01L 23/02* (2013.01); *H01L 23/26* (2013.01); *B32B 2307/728* (2013.01); *C08K 9/04* (2013.01); *C08K 2003/2206* (2013.01); *C08K 2201/003* (2013.01); *C08K 2201/006* (2013.01); *H01L 51/5237* (2013.01); *H01L 51/5259* (2013.01)

(58) Field of Classification Search
None
See application file for complete search history.

(56) References Cited

U.S. PATENT DOCUMENTS

2002/0183431 A1* 12/2002 Kawaguchi ............... C08K 3/00
                                                                524/394
2014/0166927 A1*  6/2014 Watanabe ............ B01J 20/3085
                                                                252/181.4

* cited by examiner

Primary Examiner — Sheeba Ahmed
(74) Attorney, Agent, or Firm — Locke Lord LLP

(57) ABSTRACT

A moisture-absorbing sheet including a hygroscopic molded article containing a resin component and a hygroscopic agent, wherein (1) calcium oxide-based particles having a specific surface area of 0.5 m$^2$/g to 20 m$^2$/g and an average particle diameter of 0.5 μm to 50 μm are included as the hygroscopic agent; (2) a fibrillated fluororesin is included as the resin component; and (3) the sheet has: (a) a weight increase ratio of 1% or less after being allowed to stand for 2 hours in an atmosphere at a temperature of 20° C. and a relative humidity of 65%; and (b) a weight increase ratio of 5% or more after being allowed to further stand for 36 hours after being allowed to stand for 36 hours in an atmosphere at a temperature of 20° C. and a relative humidity of 65%.

5 Claims, 3 Drawing Sheets

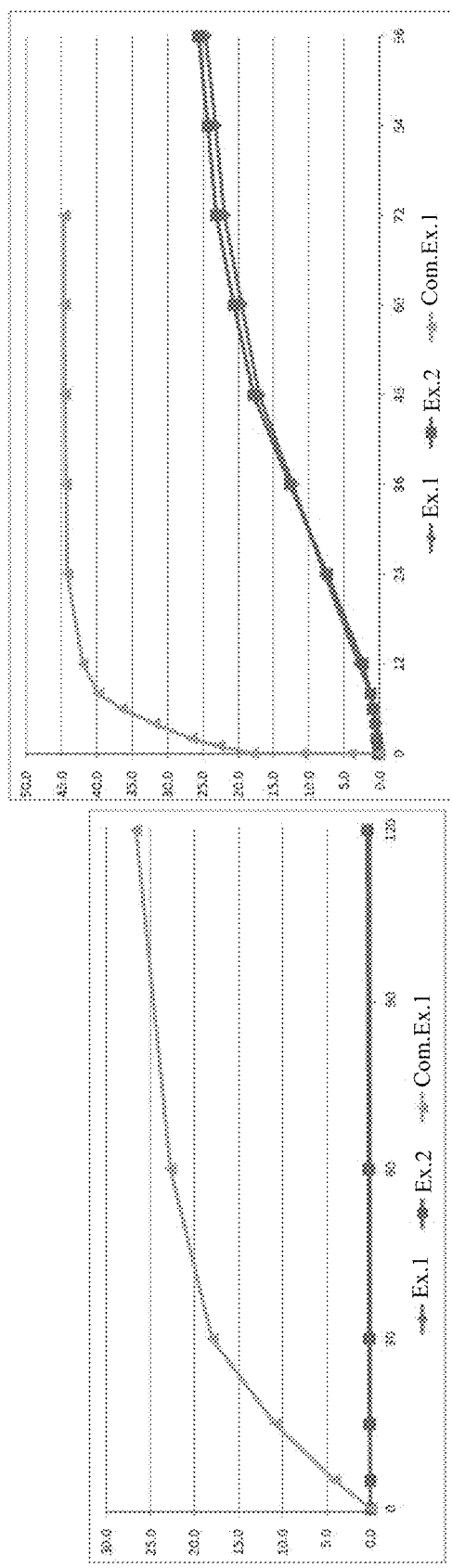

SHEET FOR ABSORBING MOISTURE

TECHNICAL FIELD

The present invention relates to a novel hygroscopic sheet.

BACKGROUND ART

In various electronic devices, the inside of the device is sealed with a housing so that moisture, dust and the like do not penetrate from the outside. In this case, a hygroscopic material may be arranged inside the housing so that even when a small amount of moisture penetrates into the housing or is generated therein, this moisture can be removed.

For example, a hygroscopic agent made of a quicklime powder produced by calcining a hydrated lime powder having a specific surface area of 10 m²/g or more for 1 hour or more under a pressure of 300 Pa or less at a temperature of 325° C. to 500° C. is known as such a hygroscopic material (Patent Document 1).

Also, for example, a hygroscopic molded article containing at least one hygroscopic agent of CaO, BaO, and SrO and a resin component is known as a hygroscopic material for electronic devices, the hygroscopic molded article containing the hygroscopic agent at 30% by weight to 85% by weight and the resin component at 15% by weight to 70% by weight, where the total amount of the hygroscopic agent and the resin component is taken as 100% by weight, and the resin component being a fluororesin which is subjected to fibrillation (Patent Document 2).

CITATION LIST

Patent Literature

[Patent Document 1] Japanese Patent Application Publication No. 2005-58949
[Patent Document 2] Japanese Patent No. 3885150

SUMMARY OF INVENTION

Technical Problem

However, since the hygroscopic agent of Patent Document 1 is powdery, it is difficult to place the hygroscopic agent in an electronic device, and particles may fall off.

Meanwhile, since the hygroscopic molded article such as disclosed in Patent Document 2 is formed into a sheet shape, the article can be easily attached inside the electronic device, and the problem of the hygroscopic agent falling off can also be solved.

However, since the hygroscopic molded article such as described hereinabove is designed to be capable of rapidly absorbing even a very small amount of moisture, the article is not suitable for applications requiring hygroscopicity for a long period of time. Moreover, with the conventional hygroscopic molded article, where the operation of attaching the hygroscopic molded article to the electronic device is performed at a normal temperature and under a normal humidity, moisture absorption occurs immediately and reaches a saturated state because of exceedingly high hygroscopicity of the hygroscopic molded article. Therefore, when arranging the hygroscopic molded article in an electronic device, the operation needs to be performed under special conditions in which moisture is hardly present.

As described above, it is particularly desirable to develop a sheet-shaped hygroscopic molded article capable of exhibiting a desired hygroscopicity even when the hygroscopic molded article is attached at a normal temperature and under a normal humidity and also capable of maintaining hygroscopicity over a long period of time, but at the present time such a hygroscopic molded article has not yet been developed.

Accordingly, a main object of the present invention is to provide a moisture-absorbing sheet which can effectively exhibit moisture absorbability even when the hygroscopic molded article is attached at a normal temperature and under a normal humidity, and also can maintain moisture absorbability for a long period of time.

Solution to Problem

The inventors of the present invention have conducted extensive research in consideration of the problems of the related art. As a result, it was found out that the abovementioned object can be achieved, in particular, by using a specific hygroscopic molded article. This finding led to the completion of the present invention.

That is, the present invention relates to the following moisture-absorbing sheet.

1. A moisture-absorbing sheet including a hygroscopic molded body containing a resin component and a hygroscopic agent, wherein
(1) calcium oxide-based particles having a specific surface area of 0.5 m²/g to 20 m²/g and an average particle diameter of 0.5 μm to 50 μm are included as the hygroscopic agent;
(2) a fibrillated fluororesin is included as the resin component; and
(3) the sheet has: (a) a weight increase ratio of 1% or less after being allowed to stand for 2 hours in an atmosphere at a temperature of 20° C. and a relative humidity of 65%; and (b) a weight increase ratio of 5% or more after being allowed to further stand for 36 hours after being allowed to stand for 36 hours in an atmosphere at a temperature of 20° C. and a relative humidity of 65%.

2. The moisture-absorbing sheet according to the above 1, wherein the calcium oxide-based particles are calcium oxide particles or particles obtained by coating the surface of the calcium oxide particles with a dispersant.

3. The moisture-absorbing sheet according to the above 1, including at least a layer composed of the hygroscopic molded body, a pressure-sensitive adhesive layer, a base material layer, and a pressure-sensitive adhesive layer in this order.

4. The moisture-absorbing sheet according to the above 1, which is used in a step of disposing the moisture-absorbing sheet in a space of an electronic device at a normal temperature and under a normal humidity and then sealing the space.

5. A method for manufacturing an electronic device incorporating a moisture-absorbing sheet, the method including:
(1) a step of fixing the moisture-absorbing sheet according to clause 1 in a space of an electronic device at a normal temperature and under a normal humidity; and
(2) a step of sealing the space at a normal temperature and under a normal humidity.

Advantages of Invention

According to the present invention, it is possible to provide a moisture-absorbing sheet which can effectively exhibit moisture absorbability and in which the adsorption of a solvent can be effectively inhibited even when the hygroscopic molded article is attached at a normal temperature and under a normal humidity, the moisture-absorbing sheet being capable of maintaining the moisture absorbability for a long period of time.

In particular, in the moisture-absorbing sheet of the present invention, since the hygroscopic agent having specific properties is fixed in the fibrillated fluororesin, the hygroscopicity at the beginning of use (for example, within 6 hours) is hardly demonstrated, whereas at a later stage, satisfactory hygroscopicity can be continuously demonstrated for a long period of time. For this reason, after the operation of attaching the moisture-absorbing sheet is performed at a stage where hygroscopicity is hardly demonstrated, satisfactory hygroscopicity is demonstrated in the housing of the electronic device after the attachment. Therefore, it is possible to achieve both the operability and the long-term moisture absorbability.

Further, since a conventional hygroscopic molded article has high hygroscopicity, a solvent is easily adsorbed thereby. For example, where a solvent (adhesive component or the like) used in the manufacturing process of an electronic device (particularly during the process of placing the conventional hygroscopic molded article in the electronic device) is vaporized and adsorbed by the conventional hygroscopic molded article and the conventional hygroscopic molded article is placed into the electronic device, the residual solvent in the hygroscopic molded article is released, which may cause malfunction of the electronic device. By contrast, in the moisture-absorbing sheet of the present invention, since the moisture absorption rate is gentle, the possibility of adsorbing the solvent is low, so that the problem of residual solvent can also be avoided in advance.

The moisture-absorbing sheet of the present invention having such characteristics is expected to be suitable for various applications such as electronic materials, mechanical materials, automobiles, communication equipment, building materials, medical materials, precision equipment, and the like. In particular, since excellent moisture absorbability can be demonstrated over a long period of time, the moisture-absorbing sheet of the present invention can be effectively used also for medical instruments implanted in a living body for a long term such as cardiac pacemakers and other devices requiring long-term hygroscopicity.

BRIEF DESCRIPTION OF THE DRAWINGS

FIG. 3(a) shows the weight increase from the start of the measurement until 120 minutes elapsed, and the weight increase ratio (%) is plotted on the ordinate and the time (minute) is plotted on the abscissa; and FIG. 3(b) shows the weight increase from the start of the measurement until 96 hours elapsed, and the weight increase ratio (%) is plotted on ordinate and the time (hour) is plotted on the abscissa.

DESCRIPTION OF EMBODIMENTS

1. Moisture-Absorbing Sheet

Figure 1:
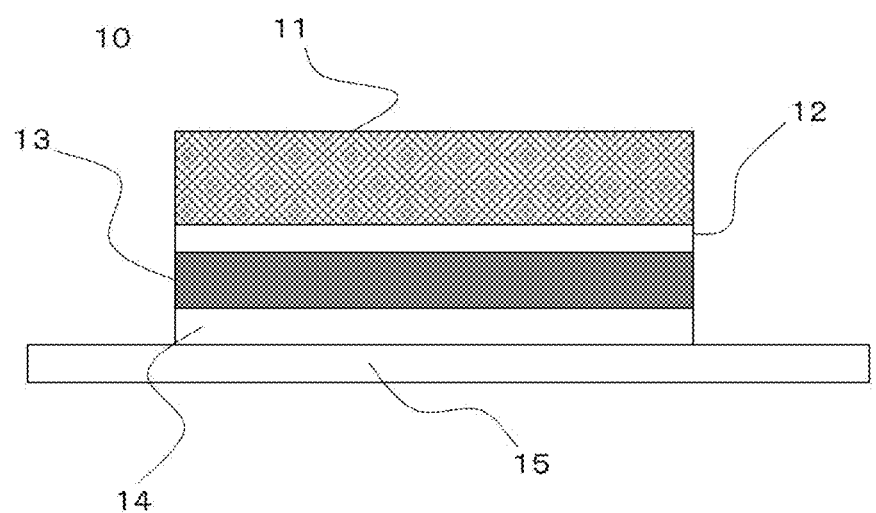
FIG. 1 is a diagram showing an example of a layer structure of a moisture-absorbing sheet of the present invention.

The moisture-absorbing sheet of the present invention (sheet of the present invention) includes a hygroscopic molded article containing a resin component and a hygroscopic agent, wherein (1) calcium oxide-based particles having a specific surface area of 0.5 $m^2/g$ to 20 $m^2/g$ and an average particle diameter of 0.5 µm to 50 µm are included as the hygroscopic agent;

(2) a fibrillated fluororesin is included as the resin component; and (3) the sheet has: (a) a weight increase ratio of 1% or less after being allowed to stand for 2 hours in an atmosphere at a temperature of 20° C. and a relative humidity of 65%; and (b) a weight increase ratio of 5% or more after being allowed to further stand for 36 hours after being allowed to stand for 36 hours in an atmosphere at a temperature of 20° C. and a relative humidity of 65%.

(A) Hygroscopic Molded Article

Hygroscopic Agent

The calcium oxide-base particles used as the hygroscopic agent may be either particles of calcium oxide (CaO) per se, or composite particles in which the surface of calcium oxide particles is coated with a dispersant. Any of these can be publicly known or commercially available particles. In the present invention, a powder composed of such calcium oxide-based particles can be used as the hygroscopic agent.

The specific surface area of the hygroscopic agent is usually about 0.5 $m^2/g$ to 20 $m^2/g$, preferably 0.5 $m^2/g$ to 10 $m^2/g$, and more preferably 0.5 $m^2/g$ to 5 $m^2/g$. By setting such a relatively low specific surface area, it is possible to maintain satisfactory hygroscopicity for a long period of time without immediate saturation even when the attachment operation of the moisture-absorbing sheet is carried out at a normal temperature and under a normal humidity.

The average particle size of the hygroscopic agent is usually about 0.5 µm to 50 µm, preferably 0.5 µm to 30 µm, and more preferably 1 µm to 15 µm. By setting the particle size range as described above, it is possible to reliably obtain a desired hygroscopicity in combination with the abovementioned specific surface area. Also, the sheet can be made thinner without trouble.

The content of the calcium oxide-based particles in the hygroscopic agent is not limited, but from the viewpoint of ensuring better hygroscopicity, the content is usually about 80% by weight to 100% by weight, preferably 90% by weight to 100% by weight, and more preferably 95% by weight to 100% by weight.

A hygroscopic agent other than the calcium oxide-based particles may also be included in a range that does not substantially adversely affect the advantages of the present invention. Examples of such hygroscopic agents include alkaline earth metal oxides such as barium oxide (BaO), magnesium oxide (MgO), strontium oxide (SrO), and the like, and sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), and the like. In addition, an organic compound having hygroscopicity can also be employed as a desiccant of the present invention.

Resin Component

A fibrillated fluororesin is included as a resin component. The fluororesin is not limited as long as it can be fibrillated, and examples thereof include polytetrafluoroethylene, polychlorotrifluoroethylene, polyvinylidene fluoride, ethylene-tetrafluoroethylene copolymer, and the like.

The fluororesin is fibrillated. Accordingly, the fluororesin becomes porous and particles (powder) of the hygroscopic agent can be effectively carried and fixed therein. As a result, moisture-containing air (humid air) can permeate through the hygroscopic molded article of the sheet of the present invention As a result, a desired moisture absorbability can be obtained.

The fibrillation can be carried out by applying a shearing force or the like to the fluororesin, and a publicly known method can be employed as the means therefor. The timing of fibrillation may be at any stage, and fibrillation may be carried out simultaneously with forming of the moisture-absorbing sheet, or fibrillation may be carried out on a molded body which has been formed in advance.

For example, fibrillation can be performed simultaneously with forming the resin component into a sheet by rolling a mixed powder obtained by dry-mixing a resin component powder including a fluororesin powder and a hygroscopic agent powder. Further, for example, fibrillation can be carried out by preparing a precursor molded article that is not fibrillated and then subjecting the molded article to stretching processing or the like.

More specifically, a hygroscopic molded article can be advantageously produced by dry-mixing a hygroscopic agent powder containing calcium oxide-based particles and a fluororesin powder (for example, polytetrafluoroethylene or the like) and rolling the resultant mixed powder. In this case, rolling or stretching may be carried out using a known apparatus. The degree of fibrillation can be appropriately adjusted according to the use of the final product, desired characteristics, and the like.

The content of the fluororesin in the resin component is not limited, but from the viewpoint of reliably obtaining a porous structure, it is usually desirable that the content be 80% by weight to 100% by weight, and preferably from 90% by weight to 100% by weight.

When a resin component other than the fluororesin is included as the resin component, a gas permeable resin component can be used as the other resin component. For example, polyolefins, polyacryls, polyacrylonitriles, polyamides, polyesters, epoxy resins, polycarbonates, and the like can be used. The degree of gas permeability may be set as appropriate according to the use of the final product, desired characteristics, and the like.

In the hygroscopic molded article of the present invention, the content of the hygroscopic agent and the resin component may be appropriately set according to the types thereof or the like, but usually the content of the hygroscopic agent may be about 30% by weight to 95% by weight and the content of the resin component may be 5% by weight to 70% by weight when the total amount of the hygroscopic agent and the resin component is set to 100% by weight. The preferred range for the hygroscopic agent is about 50% by weight to 85% by weight, and the most preferred range is 55% by weight to 85% by weight, and the preferred range for the resin component is 15% by weight to 50% by weight, and the most preferred range is 15% by weight to 45% by weight.

The ratio of the total amount of the resin component and the hygroscopic agent in the hygroscopic molded article is not particularly limited, but from the viewpoint of more effectively exhibiting a desired dehumidifying performance, the ratio is usually 80% by weight to 100% by weight, especially 90% by weight to 100% by weight.

Other Components

In the hygroscopic molded article, other components can be appropriately added, as necessary, so as to not adversely affect the advantages of the present invention. For example, a gas adsorbent (excluding the hygroscopic agent), a molding aid or solvent, a pigment, an indicator, a perfume, a lubricant and the like can be blended.

Morphology and Properties of Hygroscopic Molded Article and Moisture-Absorbing Sheet The shape of the hygroscopic molded article is not limited and may be appropriately set according to the use of the final product, purpose of use, part to be used, and the like. For example, the article may be in the form of a sheet (film), pellets, a plate, particles (granules), and the like.

In the present invention, from the viewpoint of facilitating the arrangement inside an electronic device, it is preferable that the hygroscopic molded article be in the form of a sheet. The sheet thickness in the case of forming the hygroscopic molded article into a sheet shape may be set as appropriate according to the purpose of use of the final product or the like, but is usually about 50 μm to 1000 μm, and preferably 100 μm to 800 μm. When a resin coating layer is included, the thickness of the sheet includes the thickness of the resin coating layer. Therefore, the moisture-absorbing sheet of the present invention can be constituted by a sheet-shaped hygroscopic molded article alone or by laminating other layers thereon.

The moisture-absorbing sheet is characterized by having (a) a weight increase ratio of 1% or less after being allowed to stand for 2 hours in an atmosphere at a temperature of 20° C. and a relative humidity of 65%; and (b) a weight increase ratio of 5% or more after being allowed to further stand for 36 hours after being allowed to stand for 36 hours in an atmosphere at a temperature of 20° C. and a relative humidity of 65%.

The weight increase ratio in (a) hereinabove is a value represented by $[(S_2-S_0)/W]\times100(\%)$ (here, W is the weight of the hygroscopic molded article before moisture absorption, $S_0$ is the weight of the moisture-absorbing sheet before moisture absorption, and $S_2$ is the weight of the moisture-absorbing sheet after 2 hours from the start of moisture absorption).

The weight increase ratio in the (b) hereinabove is a value represented by $[(S_{72}-S_{36})/W]\times100(\%)$ (here, W is the weight of the hygroscopic molded article before moisture absorption, $S_{36}$ is the weight of the moisture-absorbing sheet after 36 hours elapsed since the start of moisture absorption, and $S_{72}$ is the weight of the moisture-absorbing sheet after additional 36 hours elapsed since $S_{36}$ (that is, after 72 hours elapsed since the start of moisture absorption)).

The above mentioned (a) is a characteristic that the weight increase ratio after the moisture-absorbing sheet has been allowed to stand for 2 hours in an atmosphere at a temperature of 20° C. and a relative humidity of 65% is 1% or less (preferably 0.8% or less).

Hereinabove, (a) is an indicator that indicates that the initial hygroscopicity is particularly controlled to be low. When the weight increase ratio in (a) exceeds 1%, the initial hygroscopicity becomes too high, and the moisture absorption amount may be close to saturation in the process of placing the moisture-absorbing sheet into the electronic device at a normal temperature and under a normal humidity. The lower limit value of the weight increase ratio of (a) is not limited, but it is usually about 0.1%.

The above mentioned (b) is a characteristic that the weight increase ratio after the moisture-absorbing sheet has been allowed to further stand for 36 hours after being allowed to stand for 36 hours in an atmosphere at a temperature of 20° C. and a relative humidity of 65% is 5% or more (preferably 9% or more, even more preferably 10% or more).

Hereinabove, (b) is an index indicating that hygroscopicity can be continuously exhibited even under the condition that the moisture absorption amount of the moisture-absorbing sheet exhibiting the conventional high hygroscopicity reaches saturation. When the weight increase ratio in (b) is less than 5%, it becomes difficult to continuously exhibit the desired hygroscopicity over a long period of time. The upper limit value of the weight increase ratio in (b) hereinabove is an amount at which the moisture absorption amount reaches saturation and this amount is dependent on a characteristic inherent to the hygroscopic agent to be used, it can generally be about 45%, for instance.

Resin Coating Layer

In the moisture-absorbing sheet of the present invention, a resin coating layer including a resin component may be formed, if necessary, on a part or the whole of the surface thereof. This makes it possible to control the hygroscopic performance of the moisture-absorbing sheet. As the resin component of the resin coating layer, any material may be used as long as it has a high gas permeability. More specifically, the same resin component as the resin component contained in the hygroscopic molded article can be used. Preferably, a polyolefin resin can be used.

A powder composed of an inorganic material or a metal material may be dispersed, if necessary, in the resin coating layer. As a result, durability against abrupt temperature changes or humidity changes can be further enhanced. In particular, powders (scaly particles) exhibiting a leafing phenomenon, such as mica and aluminum powder, are preferable. Although the content of the powder is not particularly limited, it is usually about 30% by weight to 50% by weight in the resin coating layer.

The thickness of the resin coating layer can be appropriately set according to the desired hygroscopic performance, the type of the resin component used in the resin coating layer, and the like, but is usually about 0.5 μm to 20 μm, and preferably 0.5 μm to 10 μm. Therefore, the particle size of the particles may be set so as to be generally smaller than the thickness of the resin coating layer.

(B) Method for Producing Hygroscopic Molded Article

The hygroscopic molded article can be obtained by molding a raw material mixture (mixed powder) containing a hygroscopic agent and a resin component into a desired shape. In this case, it is preferable to blend the hygroscopic agent, the gas adsorbent and the like after thoroughly drying in advance. Further, when mixing with the resin component, a molten state may be attained by heating if necessary.

A known molding or granulating method may be used for molding. For example, in addition to press molding (including hot press molding, and the like), extrusion molding, and the like, granulation with a tumbling granulator, a biaxial granulator, and the like can be used.

The fibrillation may be implemented simultaneously with the aforementioned molding, or may be carried out after preparing the precursor molded article from the raw material mixture. In the case of simultaneous implementation, a fibrillated molded article can be obtained by rolling a raw material mixture including a hygroscopic agent and a resin component. In the case of implementing fibrillation after molding, the fibrillated molded article can be obtained by producing a precursor molded body from the raw material mixture, and then fibrillating the molded body (non-fibrillated molded article) by stretching processing, rolling processing or the like. Stretching and the like herein may be carried out according to a known method, and may be any of uniaxial stretching, biaxial stretching and the like.

Further, in the case of forming a resin coating layer, the forming method thereof is not limited, and may be carried out according to a known lamination method or the like. For example, when the hygroscopic molded article is a sheet, a sheet or a film for a resin coating layer molded in advance may be laminated on at least one of the front surface and the back surface of the sheet.

(C) Moisture-absorbing Sheet and Usage Mode Thereof

As the sheet of the present invention, the hygroscopic molded article can be used as it is, or it can be used as a laminate formed by laminating the hygroscopic molded article with another layer.

When the hygroscopic molded article is used as it is as a sheet of the present invention, for example, the following methods can be employed: (a) a method in which the hygroscopic molded article is stuck to the inner surface of a housing of an electronic device with a pressure-sensitive adhesive tape, an adhesive (preferably, a solvent-free adhesive), and the like, (b) a method of heat bonding the hygroscopic molded article to the inner surface of the housing of the electronic device, and (c) a method of fixing the molded article to the inner surface of the housing of the electronic device with a fixing tool such as bolts, screws, and the like.

When a laminate including a hygroscopic molded article and another layer is used as the sheet of the present invention, a sheet comprising at least the hygroscopic molded article layer, an adhesive layer, a base material layer, and an adhesive layer in this order can be advantageously used. For example, as shown in FIG. 1, a sheet 10 including a hygroscopic molded article layer 11, a pressure-sensitive adhesive layer 12, a base material layer 13, a pressure-sensitive adhesive layer 14, and a release sheet 15 in this order can be advantageously used as the sheet of the present invention. When this sheet is arranged inside an electronic device, the same method as in the above (a) to (c) can be used. For example, the arrangement can be performed relatively easily by peeling off the release sheet 15 and then bonding to a part or the whole of the inner surface of the housing of the electronic device with the pressure-sensitive adhesive layer 14 interposed therebetween so that the hygroscopic molded article layer is the outermost layer. After attaching the moisture-absorbing sheet, the housing may be hermetically sealed according to a known method.

When the sheet of the present invention is used as a laminate, publicly known or commercially available materials can be used for the base material layer, the pressure-sensitive adhesive layer and the release sheet. Examples of materials for the base material layer include various synthetic resin sheets such as polyesters, polypropylene, acrylic resins, polyurethanes, polyethylene, polyamides, and the like, and metal foils such as aluminum foil, copper foil and the like. Examples of materials for the pressure-sensitive adhesive layer include pressure-sensitive acrylic resin based adhesives and pressure-sensitive urethane resin based adhesives. For example, paper, resin films and the like can be used for the release sheet.

2. Method for Manufacturing Electronic Device

The present invention is also inclusive of a method for manufacturing an electronic device incorporating a moisture-absorbing sheet, the method including: (1) a step of fixing the moisture-absorbing sheet of the present invention in a space of an electronic device at a normal temperature and under a normal humidity (arrangement step), and (2) a step of sealing the space at a normal temperature and under a normal humidity (sealing step).

Arrangement Step

In the arrangement step, the moisture-absorbing sheet of the present invention is fixed in a gap in the electronic device at a normal temperature and under a normal humidity.

When the hygroscopic molded article is used as it is as the sheet of the present invention, it may be arranged in the space (housing) of the electronic apparatus. In this case, it can be fixed by a known fixing means such as a pressure-sensitive adhesive tape, an adhesive, and the like.

When a laminate including the hygroscopic molded article is used as the sheet of the present invention, the laminate may be arranged and fixed so that the hygroscopic molded article becomes the outermost layer (as a layer exposed to an atmosphere). For example, in the case of using the laminate as shown in FIG. 1, the hygroscopic molded article layer is fixed to the base material sheet 13 by the double-sided adhesive tape 12, and the lower surface of the double-sided adhesive tape 14 which is exposed by peeling off the release film 15 located below the double-sided adhesive tape 14 laminated as the underlayer of the base material sheet 13 is stuck and fixed to the inner surface of the space.

The temperature and humidity in the arrangement step are not limited, and the arrangement step can be carried out under a usual atmosphere. Further, as for the pressure, the arrangement step may be carried out under atmospheric pressure.

The arrangement step can be advantageously carried out at a normal temperature and under a normal humidity. In this case, the standard state described in JIS Z 8703 (1983) is taken as a reference. Specifically, the temperature is 5° C. to 35° C. and the humidity is 45% to 85%. In the present invention, even when the moisture-absorbing sheet is exposed under such conditions, the state of relatively low hygroscopicity is maintained. As a result, desired hygroscopicity can be continuously exhibited within the sealed space.

The electronic device is not particularly limited as long as it has a space to be hermetically sealed. For example, the sheet of the present invention can be attached to the inner surface of a sealable housing of a medical device, for example, an artificial heart-lung machine, a radiotherapy device, an image diagnostic device, a dialysis device, an implantable medical device (pacemaker, nerve stimulation device, defibrillator, and the like) and the like, as well as various electronic devices and the like. In this case, since the sheet of the present invention can be made flexible, it can be fixed not only to a flat surface but also to a curved surface or the like.

Sealing Step

In the sealing step, the space is sealed at a normal temperature and under a normal humidity. The sealing method itself can be carried out according to a known method, and sealing can be performed by heat sealing, welding or the like.

The temperature and humidity in the sealing step are not limited, and the sealing step can be carried out under a usual atmosphere. Further, as for the pressure, the arrangement step may be carried out under atmospheric pressure.

The sealing step can be advantageously carried out at a normal temperature and under a normal humidity. In this case, the standard state described in JIS Z 8703 (1983) is taken as a reference. Specifically, the temperature is 5° C. to 35° C. and the humidity is 45% to 85%. In the present invention, even when the moisture-absorbing sheet is exposed under such atmosphere, the state of relatively low hygroscopicity is maintained, so that desired hygroscopicity can be continuously obtained in the sealed space.

EXAMPLES

Hereinbelow, examples and comparative examples are illustrated, and features of the present invention are described more specifically. However, the scope of the present invention is not limited to the examples.

Example 1

In addition to a total of 100 parts by weight including 70 parts by weight of a calcium oxide-based powder (product name "CML 35", manufactured by Ohmi Chemical Industry Co., Ltd.) as a hygroscopic agent and 30 parts by weight of a fluorine-based resin powder (polytetrafluoroethylene (PTFE)), acetylene black was used in an amount of 2 parts by weight with respect to the total of 100 parts by weight to prepare a hygroscopic molded article.

Initially, the components were thoroughly mixed in a powder form. The obtained mixed powder was rolled into a sheet shape with a roll processing machine and cut to a predetermined size to obtain a sheet piece (thickness 250 μm×length 30 mm×width 30 mm). Observations of the obtained sheet piece with a scanning electron microscope ("JSM-6010LA" manufactured by JEOL Ltd.) confirmed a porous structure in which the PTFE resin was fibrillated and particles of the hygroscopic agent were fixed on the fibrillated resin.

The BET specific surface area of the hygroscopic agent was measured by a specific surface area—pore distribution measuring apparatus ("ASAP 2010" manufactured by Shimadzu Corporation). The result was about 1.7 m²/g. Further, the average particle diameter of the hygroscopic agent was measured with a laser type particle size distribution measuring apparatus ("Microtrac (registered trademark) MT 3000" manufactured by Nikkiso Co., Ltd.). The result was about 12 μm. Further, the density measured by the Archimedes method was 1.80 g/cm³.

The obtained sheet piece was used as a hygroscopic molded article, and a moisture-absorbing sheet 10 as shown in FIG. 1 was configured. Thus, a double-sided acrylic pressure-sensitive adhesive tape 12 was stuck to one side of the sheet piece 11 and a 12 μm PET film was stuck as the base material sheet 13 to the other side of the adhesive tape 12. Further, a double-sided acrylic pressure-sensitive adhesive tape 14 similar to the above tape was stuck to the back surface of the base material sheet 13. In this manner, a moisture-absorbing sheet was obtained. The opposite surface of the adhesive tape 14 of the moisture-absorbing sheet was stuck to a stainless steel tray 15.

Example 2

A moisture-absorbing sheet was prepared in the same manner as in Example 1 except that the thickness of the hygroscopic molded article was 270 μm and the density was 2.18 g/cm³.

Comparative Example 1

Calcium hydroxide was calcined for 15 hours at 500° C. and under reduced pressure to obtain calcium oxide having a specific surface area of 60 m²/g and an average particle diameter of 5 μm. A moisture-absorbing sheet was prepared in the same manner as in Example 1 except that this calcium oxide was used. The hygroscopic molded article had a thickness of 250 μm.

Test Example 1

Samples of moisture-absorbing sheets obtained in Examples and Comparative Examples were placed in a thermostatic chamber (temperature: 20° C., humidity: 65%), and weight change and weight change ratio thereof were examined. The increased weight (mg) is shown in Table 1 and FIG. 2, and the weight increase ratio (%) is shown in Table 2 and FIG. 3.

Figure 2A:
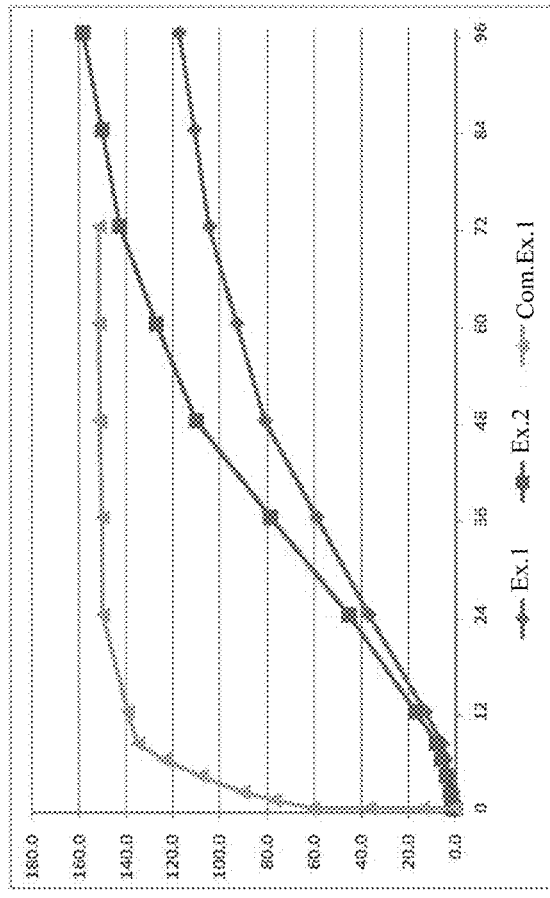
FIG. 2(a) shows the weight increase from the start of the measurement until 120 minutes elapsed, and the weight increase (mg) is plotted on the ordinate and the time (minute) is plotted on the abscissa.
Figure 2B:
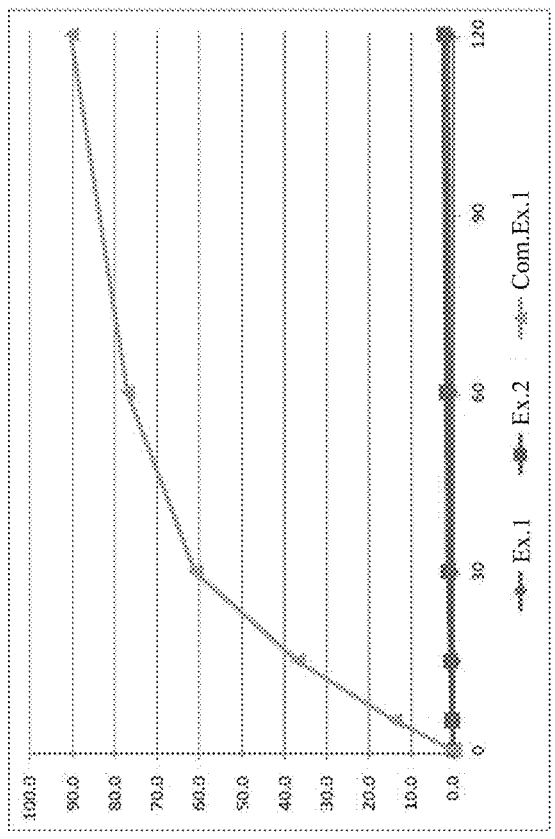
FIG. 2(b) shows the weight increase from the start of the measurement until 96 hours elapsed, and the weight increase (mg) is plotted on the ordinate and the time (hour) is plotted on the abscissa.

FIG. 2(*a*) shows the weight increase from the start of the measurement until 120 minutes elapsed; the weight increase (mg) is plotted on the ordinate and the time (minute) is plotted on the abscissa. FIG. 2(*b*) shows the weight increase from the start of the measurement until 96 hours elapsed; the weight increase (mg) is plotted on the ordinate and the time (hour) is plotted on the abscissa.

FIG. 3(*a*) shows the weight increase from the start of the measurement until 120 minutes elapsed; the weight increase ratio (%) is plotted on the ordinate and the time (minute) is plotted on the abscissa. FIG. 3(*b*) shows the weight increase from the start of the measurement until 96 hours elapsed; the weight increase ratio (%) is plotted on the ordinate and the time (hour) is plotted on the abscissa.

The method for measuring the sample weight was carried out as follows, while preparing the moisture-absorbing sheet as shown in FIG. 1. Initially, the hygroscopic molded article was cut to a length of 30 mm and a width of 30 mm in a state at a temperature of 20° C. and a relative humidity of 0.81% or less to obtain a processed hygroscopic molded article 11. Then, the weight (W (unit mg)) of the hygroscopic molded article 11 was immediately measured in a state at a temperature of 20° C. and a humidity of 65%, the hygroscopic molded article 11 was then attached to a laminate composed of the double-sided pressure-sensitive adhesive tape 12, the base material sheet 13, the double-sided pressure-sensitive adhesive tape 14, and the release film 15, the obtained laminate was taken as a workpiece and the weight ($S_0$) thereof was measured. The moisture absorption test using this workpiece was started and the weight ($S_t$) of the workpiece was measured every specific time (t). The sizes of the workpiece from the hygroscopic molded article 11 to the double-sided pressure-sensitive adhesive tape 14 were 30 mm×30 mm. Five workpieces (n=5) were prepared for each test, and the average value of the measurement results was obtained. The weight increase (moisture absorption weight) (unit: mg) of the moisture-absorbing sheet after a specific time had elapsed was determined by calculating $S_t - S_0$. Further, the weight increase ratio at each time was obtained by $[(S_t - S_0)/W] \times 100(\%)$.

TABLE 1

| Elapsed time (min) | 0 | 5 | 15 | 30 | 60 | 120 | 240 | 360 | 480 | 720 | 1440 | 2160 | 2880 | 3600 | 4320 | 5040 | 5760 |
|---|---|---|---|---|---|---|---|---|---|---|---|---|---|---|---|---|---|
| Elapsed time (h) | 0 | 0.08 | 0.25 | 0.5 | 1 | 2 | 4 | 6 | 8 | 12 | 24 | 36 | 48 | 60 | 72 | 84 | 96 |
| Example 1 | 0.0 | 0.0 | 0.1 | 0.5 | 0.8 | 1.4 | 2.5 | 4.2 | 5.7 | 12.9 | 36.9 | 59.1 | 81.1 | 93.1 | 104.6 | 110.8 | 117.3 |
| Example 2 | 0.0 | 0.4 | 0.7 | 1.3 | 1.7 | 2.4 | 3.9 | 6.0 | 7.8 | 17.0 | 45.5 | 78.8 | 110.1 | 127.1 | 142.7 | 150.2 | 158.3 |
| Comparative Example 1 | 0.0 | 13.9 | 36.9 | 61.0 | 77.1 | 90.4 | 108.3 | 123.7 | 135.1 | 139.3 | 150.0 | 150.2 | 151.2 | 151.5 | 151.5 | — | — |

TABLE 2

| Elapsed time (min) | 0 | 5 | 15 | 30 | 60 | 120 | 240 | 360 | 480 | 720 | 1440 | 2160 | 2880 | 3600 | 4320 | 5040 | 5760 |
|---|---|---|---|---|---|---|---|---|---|---|---|---|---|---|---|---|---|
| Elapsed time (h) | 0 | 0.08 | 0.25 | 0.5 | 1 | 2 | 4 | 6 | 8 | 12 | 24 | 36 | 48 | 60 | 72 | 84 | 96 |
| Example 1 | 0.0 | 0.0 | 0.0 | 0.1 | 0.2 | 0.3 | 0.5 | 0.9 | 1.2 | 2.9 | 7.7 | 12.3 | 17.0 | 19.5 | 22.0 | 23.2 | 24.6 |
| Example 2 | 0.0 | 0.1 | 0.1 | 0.2 | 0.3 | 0.4 | 0.6 | 1.0 | 1.3 | 2.3 | 7.4 | 12.7 | 17.8 | 20.6 | 23.1 | 24.3 | 25.6 |
| Comparative Example 1 | 0.0 | 4.1 | 10.9 | 18.0 | 22.7 | 26.6 | 31.9 | 36.5 | 39.8 | 42.0 | 44.2 | 44.4 | 44.6 | 44.6 | 44.6 | — | — |

As apparent from these results, in the moisture-absorbing sheets of Examples 1 and 2, (a) the weight increase ratio after the moisture-absorbing sheets were allowed to stand for 2 hours in an atmosphere at a temperature of 20° C. and a relative humidity of 65% was 0.5% or less and the moisture absorbability was effectively reduced, whereas (b) the weight increase ratio after the moisture-absorbing sheets were allowed to further stand for 36 hours after being allowed to stand for 36 hours in an atmosphere at a temperature of 20° C. and a relative humidity of 65% was [22.0−12.3]=9.7% in Example 1 and [23.1−12.7]=10.4% in Example 2, and a high hygroscopicity of 9% or more was demonstrated in both cases. By contrast, in Comparative Example 1, a high moisture absorbability was performed from the start of moisture absorption and an almost saturated state was reached after 36 hours had elapsed. As a result, the weight increase ratio after the moisture-absorbing sheet was allowed to further stand for 36 hours after being allowed to stand for 36 hours was [44.6−44.4]=0.2%.

The invention claimed is:

1. A moisture-absorbing sheet comprising a hygroscopic molded article containing a resin component and a hygroscopic agent,
   (1) the hygroscopic agent comprising calcium oxide-based particles having a specific surface area of 0.5 m²/g to 1.7 m²/g and an average particle diameter of 0.5 μm to 50 μm;
   (2) the resin component comprising a fibrillated fluororesin; and
   (3) the sheet having
   a) a weight increase ratio of 1% or less after being allowed to stand for 2 hours in an atmosphere at a temperature of 20° C. and a relative humidity of 65%; and
   b) a weight increase ratio of 5% or more after being allowed to further stand for 36 hours after being allowed to stand for 36 hours in an atmosphere at a temperature of 20° C. and a relative humidity of 65%.

2. The moisture-absorbing sheet according to claim 1, wherein the calcium oxide-based particles are calcium oxide particles or particles in which the surface of calcium oxide particles is covered with a dispersant.

3. The moisture-absorbing sheet according to claim 1, comprising at least a layer of the hygroscopic molded article layer, an adhesive layer, a base material layer, and an adhesive layer in this order.

4. The moisture-absorbing sheet according to claim 1, which is used in a step of disposing the moisture-absorbing sheet in an enclosure of an electronic device at a normal temperature and under a normal humidity and then sealing the space.

5. A method for manufacturing an electronic device including a moisture-absorbing sheet, the method comprising:
   (1) a step of fixing the moisture-absorbing sheet according to claim 1 in an enclosure of an electronic device at a normal temperature and under a normal humidity; and
   (2) a step of sealing the enclosure at a normal temperature and under a normal humidity.

* * * * *